United States Patent
Fujihira et al.

(10) Patent No.: US 6,548,865 B2
(45) Date of Patent: *Apr. 15, 2003

(54) HIGH BREAKDOWN VOLTAGE MOS TYPE SEMICONDUCTOR APPARATUS

(75) Inventors: Tatsuhiko Fujihira, Nagano (JP);
Takeyoshi Nishimura, Nagano (JP);
Takashi Kobayashi, Nagano (JP)

(73) Assignee: Fuji Electric Co., Ltd. (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/799,430

(22) Filed: Mar. 5, 2001

(65) Prior Publication Data

US 2001/0009287 A1 Jul. 26, 2001

Related U.S. Application Data

(62) Division of application No. 09/042,544, filed on Mar. 17, 1998, now Pat. No. 6,246,092.

(30) Foreign Application Priority Data

Mar. 17, 1997 (JP) ............................................. 9-063535

(51) Int. Cl.[7] .............................................. H01L 29/76
(52) U.S. Cl. ...................... 257/341; 257/342; 257/343; 257/374
(58) Field of Search ................................ 257/341–343, 257/374

(56) References Cited

U.S. PATENT DOCUMENTS

| 5,073,511 | A | | 12/1991 | Musumeci et al. ............ 437/40 |
|---|---|---|---|---|
| 5,079,608 | A | | 1/1992 | Wodarczyk et al. ...... 357/23.13 |
| 5,091,664 | A | | 2/1992 | Furuhata ....................... 307/570 |
| 5,212,396 | A | | 5/1993 | Nakagawa et al. .......... 257/212 |
| 5,365,099 | A | | 11/1994 | Phipps et al. ................. 257/328 |
| 5,488,236 | A | * | 1/1996 | Baliga et al. ................. 257/132 |
| 5,545,908 | A | * | 8/1996 | Tokura et al. ................ 287/341 |
| 5,605,865 | A | * | 2/1997 | Maniar et al. ............... 437/200 |
| 5,631,483 | A | * | 5/1997 | Ferla et al. ................... 257/342 |
| 6,246,092 | B1 | * | 6/2001 | Fulihira et al. | |

FOREIGN PATENT DOCUMENTS

| EP | 0566179 A1 | 10/1993 |
|---|---|---|
| JP | 62-73766 | 4/1987 |
| JP | 2-92111 | 3/1990 |
| JP | 2-185069 | 7/1990 |
| JP | 4-364784 | 12/1992 |
| JP | 8-255902 | 10/1996 |
| JP | 9-186315 | 7/1997 |

OTHER PUBLICATIONS

Device Electronics for Integrated Circuits, 2nd Edition Muller & Kamins, 1986.*

* cited by examiner

Primary Examiner—Fetsum Abraham
(74) Attorney, Agent, or Firm—Rossi & Associates

(57) ABSTRACT

A MOS type semiconductor apparatus is provided that includes a first MOS type semiconductor device through which main current flows, and a second MOS type semiconductor device through which current that is smaller than the main current flows. The first and second MOS type semiconductor devices provided on the same semiconductor substrate have substantially the same structure, and have a common drain electrode. A gate electrode of the second MOS type semiconductor device is connected to the common drain electrode. The semiconductor apparatus further includes a plurality of pairs of Zener diodes which are connected in series and provided between the source electrode of the second MOS type semiconductor device and the gate electrode of the first MOS type semiconductor device. Each pair of Zener diodes are reversely connected to each other.

16 Claims, 8 Drawing Sheets

HIGH BREAKDOWN VOLTAGE MOS TYPE SEMICONDUCTOR APPARATUS

This is a Division of application Ser. No. 09/042,544 filed Mar. 17, 1998 U.S. Pat. No. 6,246,092.

FIELD OF THE INVENTION

The present invention relates to a MOS type semiconductor device, such as a MOS field-effect transistor (hereinafter referred to as "MOSFET") or an insulated gate bipolar thyristor (hereinafter referred to as "IGBT"), wherein a plurality of source regions having gates of metal-oxide-semiconductor (MOS) structure are separately formed in a surface layer of a semiconductor substrate.

BACKGROUND OF THE INVENTION

To produce MOSFET as one example of the MOS type semiconductor device, for example, p base regions are formed by diffusing impurities into selected areas of a surface layer of an n type semiconductor substrate such that pn junctions are exposed onto the surface of the substrate, and n source regions are similarly formed in surface layers of the p base regions. A gate electrode layer is then formed on an insulating film over surfaces of channel regions provided by surface layers of the p base regions each interposed between the adjacent n source region and the n type semiconductor substrate, and a source electrode is formed in contact with both of the p base regions and n source regions. A drain electrode is formed on the other surface of the n type semiconductor substrate. By applying a suitable voltage to the gate electrode, an inversion layer appears in each channel region, to reduce resistance between the drain electrode and the source electrode, and current is allowed to flow between the drain electrode and the source electrode through the inversion layer.

To produce IGBT as another example, an additional p type region is formed oil one side of the MOSFET where the drain electrode is formed. With the p type region thus added, the IGBT is capable of modulating the conductivity by utilizing injection of minority carriers from the p type region.

The MOS type semiconductor device as described above is widely used in a switching circuit because the device has low ON-state resistance and high switching speed, and is easy to be controlled by use of voltage.

In recent years, the MOS type semiconductor device used as a switching device in a switching circuit is more likely to receive surge voltage, which may be generated due to simplified configuration of the switching circuit from which snubbers are eliminated, for example, and reduction in the size of the semiconductor device. In a circuit in which inductive load current is to be cut off, for example, the voltage applied to the MOS type semiconductor device is increased due to energy stored in an inductor, and sometimes becomes even higher than power supply voltage. This excessive voltage stress may cause breakdown of the MOS type semiconductor device, and it has been thus desired to increase the breakdown voltage (avalanche current) of the semiconductor device.

As one method for improving the capability of the MOS type semiconductor device to withstand avalanche breakdown, a part of the p base region is formed with a larger diffusion depth. The increase in the diffusion depth, however, affects the ON-state resistance and other characteristics of the semiconductor device. For example, if the depth of a part of the p base region is changed from 5 $\mu$m to 7 $\mu$m in a certain MOSFET, the avalanche current increases by 25%, but at the same time the ON-state resistance increases by 15%. Thus, this method is not altogether desirable.

FIG. 11 is a cross-sectional view of MOSFET (as disclosed in U.S. Pat. No. 5,365,099) that employs another method for increasing the breakdown voltage.

An ordinary MOSFET is shown in the left-side portion of FIG. 11. In this MOSFET, an n drift layer 13 is superposed on an n$^+$ drain layer 11, and a plurality of p base regions 14 and p$^+$ contact regions 15 inside the regions 14 are formed in a surface layer of the n drift layer 13. Further, n source regions 16 are formed in surface layers of the p base regions 14. A gate electrode layer 18 made of polycrystalline silicon, for example, is formed on a gate oxide film 17 over portions of the p base regions 14 that are interposed between the n source regions 16 and an exposed face of the n drift layer 13. A source electrode 19 made of Al alloy is formed in contact with both the p base regions 14 (p$^+$ contact regions 15) and the n source regions 16. The source electrode 19 extends over the gate electrode layer 18 such that these electrodes 18, 19 are insulated from each other by an interlayer insulating film 21 made of boron phosphorous silica glass (BPSG). A drain electrode 20 made of Al—Si alloy is formed on the rear surface of the n$^+$ drain layer 11. A unit structure having n source region 16, source electrode 19 and other elements above and below the p base region 14 will be called a cell structure. The cell structure is often formed in polygonal or rectangular shape, and a multiplicity of such cell structures are arranged in parallel with each other in an actual MOSFET.

A means for increasing the avalanche current is illustrated in the right-side portion of FIG. 11. An n$^+$ contact region 7 is formed in a surface layer of the n drift layer 13, and an auxiliary electrode 8 is formed in contact with the n$^+$ contact region 7. An array of a plurality of pairs of Zener diodes 10 that are connected in series is provided on a relatively thick oxide film 9 on the surface of the n drift layer 13. Each pair of the Zener diodes are reversely connected to each other. The above auxiliary electrode 8 is connected to one end of the series Zener diode array 10, and an electrode taken out from the other end of the Zener diode array 10 is connected to the gate electrode layers 18 of the MOSFET.

In this structure, the auxiliary electrode 8 and drain electrode 20 are held at the same potential. When a voltage applied to the drain electrode 20 increases to be higher than a clamping voltage of the series Zener diode array 10, therefore, a difference between the high voltage and the clamping voltage is applied to the gate electrode layers 18 of the MOSFET, to turn on the MOSFET thereby to protect the device.

To provide the construction of FIG. 11, however, a window must be formed through the thick oxide film 9 so that the n$^+$ contact region 7 is formed in the surface layer of the n drift layer 13, and the n$^+$ contact region 7 must be given a sufficiently large area so as to assure reliable operations.

SUMMARY OF THE INVENTION

It is therefore an object of the present invention to provide a MOS type semiconductor device which has improved capability to withstand avalanche breakdown, and can be easily manufactured and operate with high reliability.

To accomplish the above object, there is provided a MOS type semiconductor apparatus, comprising: a first MOS type semiconductor device through which first current flows, and which includes a source electrode and a gate electrode; a second MOS type semiconductor device through which second current that is smaller than the first current flows, the second MOS type semiconductor device having substantially the same structure as the first MOS type semiconductor device, and including a source electrode and a gate electrode, the first MOS type semiconductor device and the second MOS type semiconductor device being provided on the same semiconductor substrate, and having a common drain electrode, the gate electrode of the second MOS type semiconductor device being connected to the common drain electrode, and a plurality of pairs of Zener diodes which are connected in series and provided between the source electrode of the second MOS type semiconductor device and the gate electrode of the first MOS type semiconductor device, each of the plurality of pairs of Zener diodes being reversely connected to each other.

In the apparatus constructed as described above, the second MOS type semiconductor device is turned on when an excessively high voltage is applied between the drain electrode and the gate electrode of the first MOS type semiconductor device. As a result, current flows from the second MOS type semiconductor device into the gate electrode of the first MOS type semiconductor device via the plurality of pairs of Zener diodes, thereby to turn on the first MOS type semiconductor device, whereby the MOS type semiconductor apparatus is protected against the excessively high voltage, and the breakdown voltage of the apparatus can be thus increased.

Preferably, a pair of Zener diodes are provided between the gate electrode and the source electrode of the first MOS type semiconductor device. In this arrangement, when an excessively high voltage is applied between the gate electrode and the source electrode, current due to the voltage may flow through the pair of Zener diodes that provide a bypass, and thus a thin gate insulating film and other elements of the MOS type semiconductor apparatus can be protected against such an excessively high voltage.

Also, resistance is preferably provided between the gate electrode and the source electrode of the first MOS type semiconductor device. In this case, the gate electrode of the first MOS type semiconductor device, when it floats due to disconnection, or the like, can be protected against noise voltage.

Where both of the first and second MOS type semiconductor devices are insulated gate bipolar transistors, which are conductivity modulation type devices, only a small area of the first MOS type semiconductor device is required to allow large current to flow through the device.

In one form of the MOS type semiconductor apparatus of the present invention, each of the first and second MOS type semiconductor devices comprises: first main surface and second main surface that face in opposite directions; a first conductivity type drift layer; a second conductivity type base region formed in a surface layer of the first conductivity type drift layer on the side of the first main surface; a first conductivity type source region that is spaced from the first conductivity type drift layer by the second conductivity type base region; a gate electrode layer formed on a gate insulating film over a surface of the second conductivity type base region interposed between the first conductivity type source region and the first conductivity type drift layer, a source electrode formed in contact with both of the first conductivity type source region and the second conductivity type base region; a drain layer formed on a surface of the first conductivity type drift layer on the side of the second main surface; a drain electrode formed on the second main surface in contact with a surface of the drain layer; and a gate electrode formed in contact with the gate electrode layer. The thus constructed first and second MOS type semiconductor devices provide a vertical, planar type MOS semiconductor apparatus which assures sufficiently high efficiency with which its semiconductor substrate is utilized, and which may be used in many applications as a power semiconductor apparatus.

In another form of the present invention, each of the first and second MOS type semiconductor devices comprises: first main surface and second main surface that face in opposite directions, a first conductivity type drift layer having a high resistivity; a second conductivity type base region formed in a surface layer of the first conductivity type drift layer on the side of the first main surface; a first conductivity type source region that is spaced from the first conductivity type drift layer by the second conductivity type base region; a trench formed in the first conductivity type drift layer such that the first conductivity type source region is exposed to an inner wall of the trench, the trench having a larger depth than the second conductivity type base region, a gate electrode layer formed in the trench with a gate insulating film filling a space between the gate electrode layer and the inner wall of the trench, a drain layer formed on a surface of the first conductivity type drift layer on the side of the second main surface; a drain electrode formed on the second main surface in contact with a surface of the drain layer, and a gate electrode formed in contact with the gate electrode layer. The thus constructed first and second MOS type semiconductor devices provide a vertical, trench-gate-type MOS semiconductor apparatus which assures a further improved efficiency with which the semiconductor substrate is utilized, and which can be used in many applications as a power semiconductor apparatus.

In a further form of the present invention, a thick field insulating film is disposed on the first main surface between the first MOS type semiconductor device and the second MOS type semiconductor device. A part of the gate electrode layer of the second MOS type semiconductor device extends over the field insulating film. The field insulating film includes a small-thickness portion which has a smaller thickness than that of the field insulating film, and which is formed between the first conductivity drift layer and the gate electrode layer of the second MOS type semiconductor device that are located around the second conductivity type base region of the second MOS type semiconductor device. In this arrangement, an inversion layer is prevented from appearing under the thick field insulating film, and current is prevented from flowing between the second conductivity type base regions of the first and second MOS type semiconductive devices.

If the small-thickness portion of the field insulating film has substantially the same thickness as the gate insulating film, this portion may be formed at the same time when the gate insulating film is formed, without making the manufacturing process complicated.

According to another aspect of the present invention, there is provided a MOS type semiconductor apparatus, comprising: first main surface and second main surface which face in opposite directions; a first conductivity type drift layer having a high resistivity; a second conductivity type base region formed in a surface layer of the first conductivity type drift layer on the side of the first main surface; a first conductivity type source region that is spaced from the first conductivity type drift layer by the second conductivity type base region; a gate electrode layer formed on a gate insulating film over a surface of the second conductivity type base region interposed between the first conductivity type source region and the first conductivity type drift layer; a source electrode formed in contact with both of the first conductivity type source region and the second conductivity type base region; a second conductivity type drain layer formed on a surface of the first conductivity type drift layer on the side of the second main surface; a drain electrode formed on the second main surface in contact with the second conductivity type drain layer, and a gate electrode formed in contact with the gate electrode layer, wherein a ballast resistance layer is provided between the first conductivity type drift layer and the second conductivity type drain layer, the ballast resistance layer including a portion having a resistivity in a range of 0.05 to 1 Ω·cm and a thickness in a range of about 30 μm to 80 μm.

In a trench-gate-type IGBT having a trench formed with a depth larger than that of the second conductivity type base region such that the first conductivity type source region is exposed to an inner wall of the trench, too, a ballast resistance layer may be provided between the first conductivity type drift layer and the second conductivity type drain layer, and the ballast resistance layer may include a portion having a resistivity in a range of 0.05 to 1 Ω·cm and a thickness in a range of about 30 μm to 80 μm.

In the above arrangement, the ballast resistance layer is supposed to provide resistance, and serves to disperse current that would otherwise cause avalanche breakdown. If the resistivity of this ballast layer is lower than the above-indicated range, or its thickness is smaller than the above-indicated range, the layer may sufficiently function as a resistor, but may affect other characteristics of the device, for example, may increase the ON-state voltage.

Preferably, the resistivity of the ballast resistance layer is in a range of 0.1 to 0.4 Ω·m. With the resistivity thus controlled, the resulting device operates appropriately, and shows improved capability to withstand avalanche breakdown, due to the function of the ballast layer to disperse large current.

The ballast resistance layer may be of first conductivity type, or may consist of a first conductivity type portion that contacts with the drift layer, and a second conductivity type portion that contact with the drain layer. In either case, the ballast resistance layer provides resistance, and serves to disperse large current.

According to a further aspect of the present invention, a MOS type semiconductor apparatus is provided which comprises: first main surface and second main surface which face in opposite directions, a first conductivity type drift layer having a high resistivity; a second conductivity type base region formed in a surface layer of the first conductivity type drift layer on the side of the first main surface; a first conductivity type source region that is spaced from the first conductivity type drift layer by the second conductivity type base region; a gate electrode layer formed on a gate insulating film over a surface of the second conductivity type base region interposed between the first conductivity type source region and the first conductivity type drift layer; a source electrode formed in contact with both of the first conductivity type source region and the second conductivity type base region, a first conductivity type drain layer formed on a surface of the first conductivity type drift layer on the side of the second main surface, the first conductivity type drain layer having a smaller resistivity than the first conductivity type drift layer; a drain electrode formed on the second main surface in contact with a surface of the first conductivity type drain layer; and a gate electrode formed in contact with the gate electrode layer, wherein a ballast resistance layer is provided between the first conductivity type drift layer and the first conductivity type drain layer. The ballast resistance layer provides a region that will not be depleted when avalanche breakdown occurs upon application of a high voltage to the MOS type semiconductor device that is placed in an OFF state, and this ballast resistance layer has a resistivity that is substantially equal to or smaller than that of the first conductivity type drift layer, and larger than one-tenth of that of the first conductivity type drift layer, and a thickness that is at least about 1 μm.

In a trench-gate-type IGBT having a trench formed with a depth larger than that of the second conductivity type base region such that the first conductivity type source region is exposed to an inner wall of the trench, too, the first conductivity type ballast resistance layer may be provided between the first conductivity type drift layer and the first conductivity type drain layer. The ballast resistance layer provides a region that will not be depleted when avalanche breakdown occurs upon application of a high voltage to the MOS type semiconductor device that is placed in an OFF state. This ballast resistance layer has a resistivity that is substantially equal to or smaller than that of the first conductivity type drift layer, and larger than one-tenth of that of the first conductivity type drift layer, and a thickness that is at least about 1 μm.

Preferably, the thickness of the portion of the ballast resistance layer is not larger than one half (½) of that of the first conductivity type drift layer.

In the above arrangement, the ballast resistance layer is supposed to provide resistance, and serve to disperse large current. If the resistivity of this ballast layer is lower than the above-indicated range, or its thickness is smaller than the above-indicated range, the layer may sufficiently function as a resistor, but may affect other characteristics of the device, for example, may increase the ON-state voltage.

BRIEF DESCRIPTION OF THE DRAWINGS

The invention will be described in greater detail with reference to preferred embodiments thereof and the accompanying drawings, wherein.

DETAILED DESCRIPTION OF THE PREFERRED EMBODIMENTS

Some embodiments of the present invention will be described in detail with reference to the drawings. In the following description, n or p prefixed to regions, layers and the like, mean that these regions and layers have electrons or holes, respectively, as majority carriers, and n type is regarded as the first conductivity type while p type is regarded as the second conductivity type, though these conductivity types may be reversed.

First Embodiment

Figure 2A:
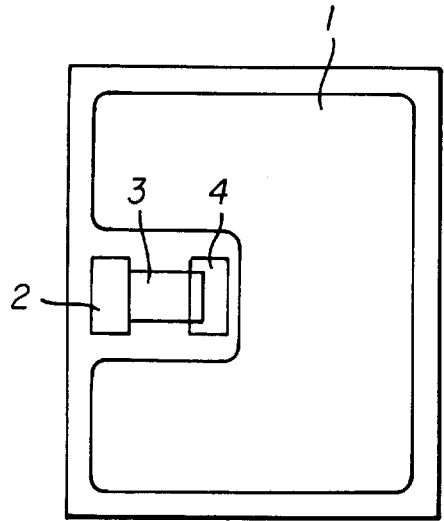
FIG. 2(a) is a plan view showing a chip having IGBT of the first embodiment.
Figure 2B:
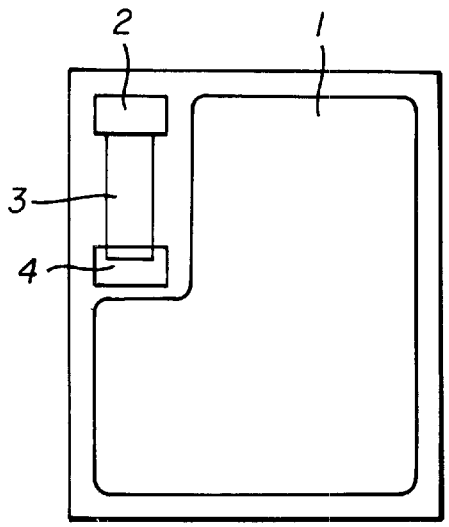
FIGS. 2(b), 2(c), 2(d) are plan views showing its modified examples.
Figure 2C:
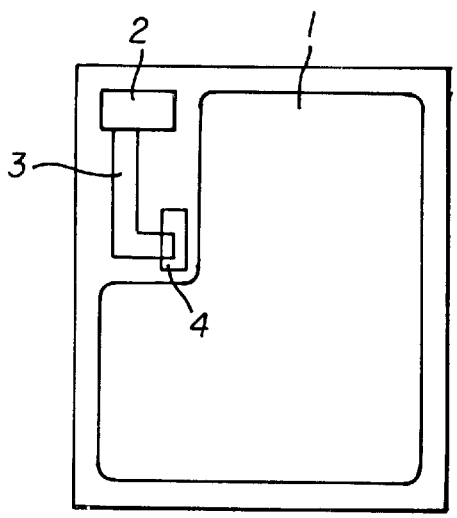
Figure 2D:
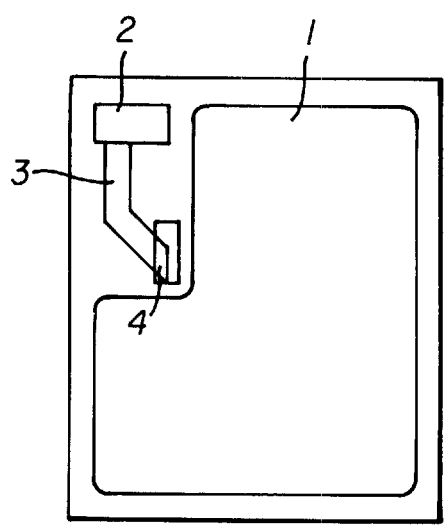

FIG. 2(a) is a plan view of an IGBT chip according to the first embodiment of the present invention. This IGBT chip includes a first MOS-type semiconductor device 1 which is a main IGBT portion that performs switching of load current, a second MOS type semiconductor device 2 which is an auxiliary IGBT portion that serves to increase breakdown voltage, an array of reversely connected pairs of Zener diodes 3 that are connected in series, and a gate pad 4. FIG. 2(b)–FIG. 2(d) show modified examples in which these components 1–4 are arranged differently from those of FIG. 2(a). The same reference numerals used in FIG. 2(a) are used to identify corresponding components in FIGS. 2(b)–2(d). As is understood from these figures, it is preferable that the second MOS type semiconductor device 2 be located in the vicinity of the periphery of the chip, and the Zener diode array 10 be located between the second MOS type semiconductor device 2 and the gate pad 4.

Figure 3:
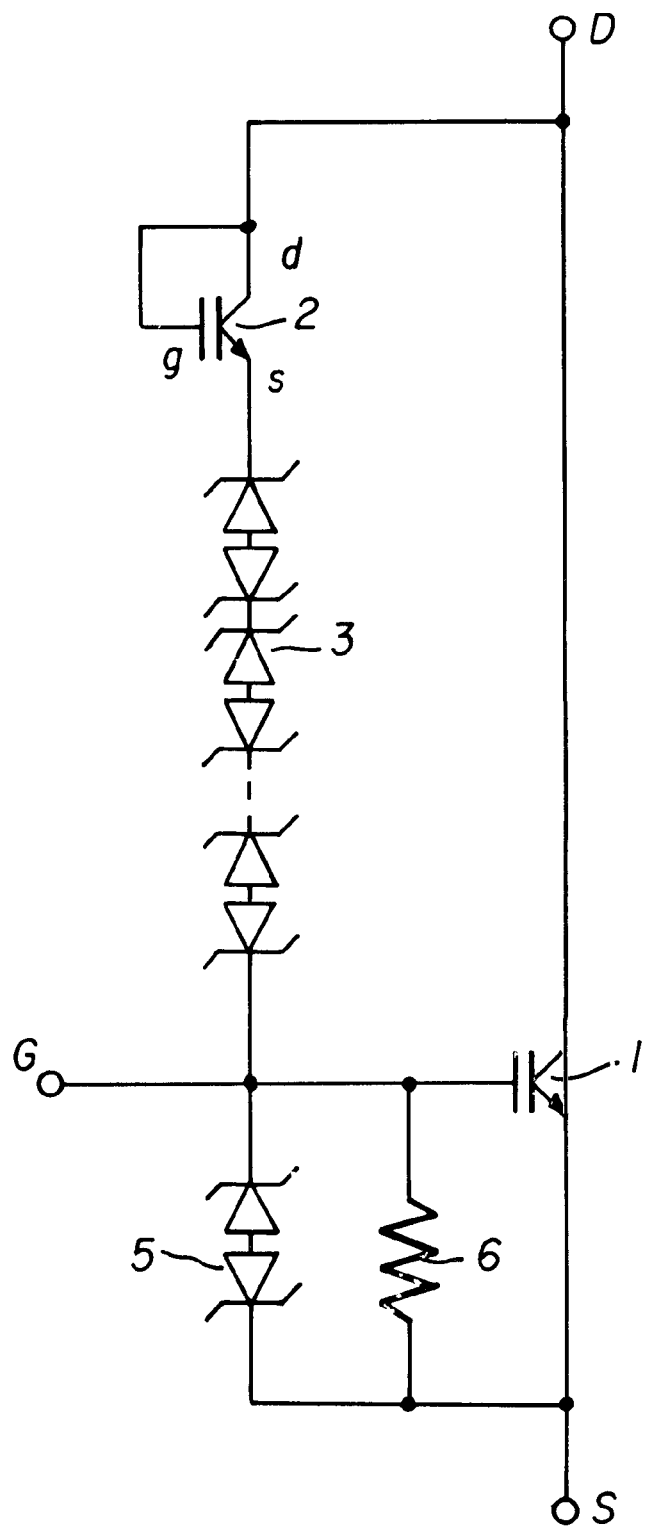
FIG. 3 is a diagram showing an equivalent circuit of the IGBT of the first embodiment.

FIG. 3 is a diagram showing an equivalent circuit of IGBT of the first embodiment. In the following, elements of the IGBT will be called by terms that are normally used for corresponding elements of MOSFET. Namely, collector and emitter of IGBT will be called drain and source, respectively. The auxiliary IGBT portion as the second MOS type semiconductor device 2 and the array of reversely connected Zener diode pairs 3 are connected in series between drain D and gate G of the main IGBT portion as the first MOS type semiconductor device 1. Drain d and gate g of the auxiliary IGBT portion 2 are short-circuited. The Zener diode array 3 is constructed such that a multiplicity of Zener diodes each pair of which are reversely connected to each other are connected in series. Between source S and gate G of the main IGBT portion 1, a pair of reversely connected Zener diodes and a resistor 6 are connected in parallel with each other. The Zener diode pair 5 provides a bypass through which current flows when an excessively large voltage is applied between the gate G and source S, thereby to protect the main IGBT portion 1. The resistor 6 functions to prevent high-voltage noises, or the like, from being applied to the gate G due to disconnection of a gate lead, for example.

Figure 4:
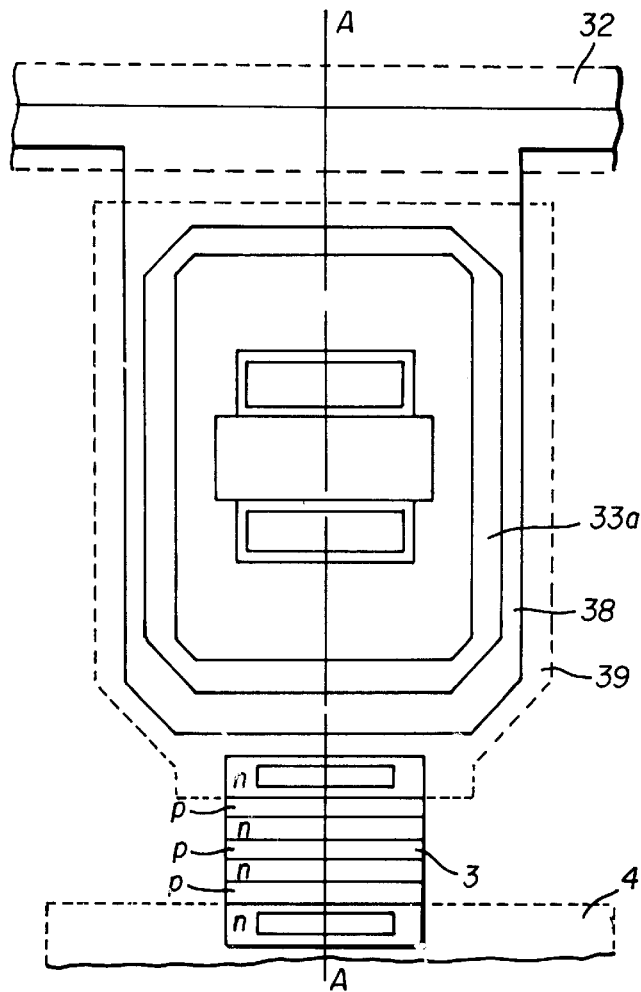
FIG. 4 is an enlarged view of an auxiliary device of the chip of the IGBT of the first embodiment.

FIG. 4 is a plan view showing in enlargement the vicinity of the auxiliary IGBT portion of the IGBT chip according to the first embodiment of FIG. 2(a). In FIG. 4, each electrode is outlined by dot lines, and a polycrystalline silicon layer is outlined by thick lines. The polycrystalline silicon layer that provides a gate electrode layer 38 of the auxiliary IGBT is formed in a pattern so that a part of the electrode layer 38 overlaps a peripheral electrode 32 of the IGBT chip. An auxiliary source electrode 39 of the auxiliary IGBT portion is held in contact with hatched portions of the surface of the silicon substrate. Also, the source electrode 39 of the auxiliary IGBT portion is connected to one end of the array of reversely connected Zener diode pairs 3. The other end of the Zener diode array 3 is connected to the gate pad 4 of the main IGBT portion.

Figure 1:
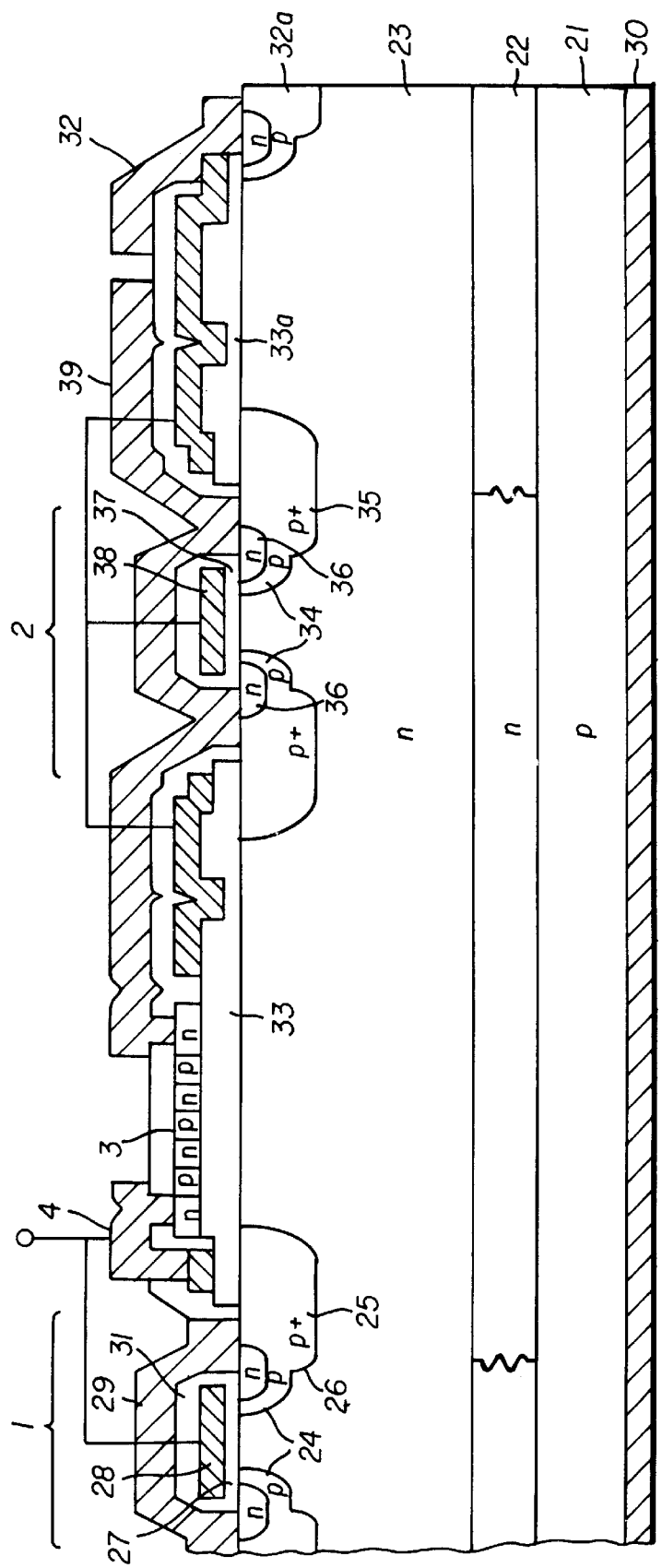
FIG. 1 is a cross-sectional view of a part of IGBT according to the first embodiment of the present invention.

FIG. 1 is a cross-sectional view taken along line A—A of FIG. 4. A left end portion of FIG. 1 shows the main IGBT portion 1 that performs switching of current.

The structure of the main IGBT portion 1 is substantially identical with that of known IGBT. Namely, mutually separated p base regions 24 are formed in a surface layer of an n drift layer 23 having high resistivity, at one of opposite major surfaces of the silicon substrate, and $p^+$ well regions 25 having a larger diffusion depth than the p base regions 24 are formed as part of the p base regions 24, for the purpose of preventing latch-up of parasitic thyristor. An $n^+$ buffer layer 22 having lower resistance than the n drift layer 23 is formed on the other surface of the n drift layer 23, and a p drain layer 21 is formed on a surface of the $n^+$ buffer layer 22 remote from the n drift layer 23. Also, p source regions 26 are formed in selected areas of surface layers of the p base regions 24. A gate electrode layer 28 made of polycrystalline silicon is formed on a gate oxide film 27 over surfaces of the p base regions 24 interposed between the n source regions 26 and the n drift layer 23. In this manner, n type IGBT is produced. The surface of the gate electrode layer 28 is covered by an insulating film 31 formed of boron phosphorous silica glass (BPSG), for example, on which a source electrode 29 is provided. Contact holes are formed so that the source electrode 29 contacts with surfaces of both of the p base regions 24 and n source regions 26, and so that a gate electrode made of a metal contacts with the gate electrode layer 28. A drain electrode 30 is formed on a surface of the p drain layer 21 remote from the $n^+$ buffer layer 22. In many cases, the source electrode 29 extends over the gate electrode layer 28, with the insulating film 31 interposed therebetween, as shown in FIG. 1.

The right-side portion of FIG. 1 shows a cross section of the auxiliary IGBT portion 2.

The structure of the auxiliary IGBT portion 2 is substantially identical with that of the main IGBT portion 1. Auxiliary p base regions 34 are formed in a surface layer of the n drift layer 23, and auxiliary $p^+$ well regions 35 having a larger diffusion depth than the auxiliary p base regions 34 are formed as part of the p base regions 34, for the purpose of preventing latch-up of parasitic thyristor. Also, auxiliary n source regions 36 are formed in selected areas of surface layers of the auxiliary p base regions 34. An auxiliary gate electrode layer 38 made of polycrystalline silicon is formed on an auxiliary gate oxide film 37 over surfaces of the auxiliary p base regions 34 interposed between the auxiliary n source regions 36 and the n drift layer 23. In this manner, n channel type IGBT is produced. The surface of the auxiliary gate electrode layer 38 is covered by an insulating film 31 made of boron phosphorous silica glass (BPSG), for example, on which an auxiliary source electrode 39 is provided. Contact holes are formed so that the auxiliary source electrode 39 contacts with surfaces of both of the auxiliary p base regions 34 and auxiliary n source regions 36. The structure on the other side of the n drift layer 23 is identical with that of the main IGBT portion 1.

Between the main IGBT portion 1 and the auxiliary IGBT portion 2, the series Zener diode array 3 is formed on a thick oxide film 33 that is formed on the n drift layer 23.

It will be understood from the cross-sectional view of FIG. 1 that the peripheral electrode 32 is connected to the auxiliary gate electrode layer 38, and the auxiliary source electrode 39 is connected to one end of the series Zener diode array 3, while an electrode taken out from the other end of the series Zener diode array 3 is connected to the gate pad 4 of the main IGBT portion 1.

To produce the IGBT of the first embodiment, which is a 600V-class device, a wafer is prepared by forming the n+ buffer layer 22 by epitaxially growing an n layer having a resistivity of 0.2 Ω·cm and a thickness of 30 μm on a p substrate having a resistivity of 0.01 Ω·cm and a thickness of 500 μm, and forming the n drift layer 23 by epitaxially growing an n layer having a resistivity of 40 Ω·cm and a thickness of about 50 μm on the buffer layer 22. The rest of the structure may be produced by almost the same process as used for producing a known IGBT, except for some minor changes, such as different patterns of masks, for example. The main IGBT portion and auxiliary IGBT portion may be fabricated at the same time since these portions may have the same dimensions. More specifically, the main and auxiliary p base regions 24, 34, main and auxiliary p+ well regions 25, 35 and p regions of the series Zener diode array 3 are formed by implantation of boron ions and thermal diffusion, and the main and auxiliary n source regions 26, 36 and n regions of the series Zener diode array 3 are formed by implantation of arsenic ions or phosphorous ions and thermal diffusion. The series Zener diode array 3 is formed from a polycrystalline silicon layer that is applied by the same reduced-pressure CVD as employed for forming the main and auxiliary gate electrode layers 28, 38. The main and auxiliary p base regions 24, 34 and main and auxiliary n source regions 26, 36 are formed by using the main and auxiliary gate electrode layers 28, 38 as part of masks, so that the edges of these regions 24, 34, 26, 36 are suitably positioned, and the widths of these regions are determined by lateral diffusion of the respective ions. The main and auxiliary source electrodes 29, 39 and gate electrode are formed by sputtering of Al alloy and subsequent photolithography, and the drain electrode 30 is formed by depositing three layers of Ti, Ni and Au by sputtering, so as to be soldered to a metallic substrate.

The dimensions of the respective regions and layers of the main IGBT portion 1 and auxiliary IGBT portion 2 may be determined as follows, for example. The diffusion depth of the main and auxiliary p+ well regions 25, 35 is 6 μm, and the diffusion depth of the main and auxiliary p base regions 24, 34 is 2 μm, while the diffusion depth of the main and auxiliary n source regions 26, 36 is 0.4 μm. The main and auxiliary gate insulating films 27, 37 have a thickness of 25 nm, and the gate electrode layers 28, 38 made of polycrystalline silicon and the insulating film 31 have a thickness of 1 μm, while the main and auxiliary source electrodes 29, 39 have a thickness of about 5 μm. The series Zener diode array 3 has a width of 100 μm.

The operation of the IGBT of the first embodiment constructed as described above will be next explained. The main source electrode 29 is grounded, and the drain electrode 30 is connected to a power supply via an inductive load. When the IGBT is switched from an ON state to an OFF state, namely, when the IGBT is turned off, the voltage applied to the drain electrode 30 is increased due to an energy stored in an inductor, as stated above. At this time, the voltage applied to the drain electrode 30 is also applied to the auxiliary gate electrode layer 38 through the peripheral electrode 32. On the other hand, the auxiliary source electrode 39 of the auxiliary IGBT portion 2 is held at a voltage that is as high as a voltage defined by clamping voltage of the series Zener diode array 3. If the voltage of the drain electrode 30 exceeds the clamping voltage, the auxiliary IGBT portion 2 is turned on. The series Zener diode array 3 is made up of about 50 pairs of Zener diodes each having a Zener voltage of about 7V, which pairs are connected in series.

When the auxiliary IGBT portion 2 is turned on, its current passes through the series Zener diode array 3, to be supplied to the gate electrode layer 28 of the main IGBT portion 1, whereby the main IGBT portion 1 is turned on. In this manner, the energy stored in the inductor is released through the whole main IGBT portion 1.

In the IGBT of the first embodiment as described above, the current that passes through the auxiliary IGBT portion 2 is supplied to the gate electrode layer 28 of the main IGBT portion 1, in order to protect the device when an excessive voltage is applied. Since the current flows through IGBT utilizing conductivity modulation, only a small area is required to supply large current, thus enabling the main IGBT portion 1 to be quickly turned on, with a result of an increase in the avalanche current.

Although not illustrated in the cross-sectional view of FIG. 1, the pair of the Zener diodes 5 and resistor 6 between the gate Gand source S shown in the equivalent circuit of FIG. 3 can be easily integrated onto the semiconductor substrate in a similar manner.

In FIG. 1, the thick oxide film 33 includes a portion 33a at which the thickness of the oxide film 33 is reduced so that a corresponding portion of the auxiliary gate electrode layer 38 is made closer to a surface layer of the silicon substrate. This portion 33a serves to prevent an inversion layer from appearing in the vicinity of the surface of the n drift layer 23 under the thick oxide film 33, thus avoid flow of current from the auxiliary p base regions 34 and p peripheral region 32a to the p base regions 24 of the main IGBT portion. If the thin portion 33a of the oxide film has almost the same thickness as the gate oxide film 27, there is no need to increase the number of process steps so as to form the thin portion 33a. In the embodiment of FIG. 4, the thin portion 33a of the oxide film 33 is formed in annular shape. The width of a portion of the oxide film 33 located outside this annular portion 33a and under the auxiliary gate electrode layer 38 is desirably controlled to be as small as possible.

Another important feature of the IGBT of the first embodiment is that the n+ buffer layer 22 has a resistivity of 0.2 Ω·cm and a thickness of 30 μm.

Figure 5:
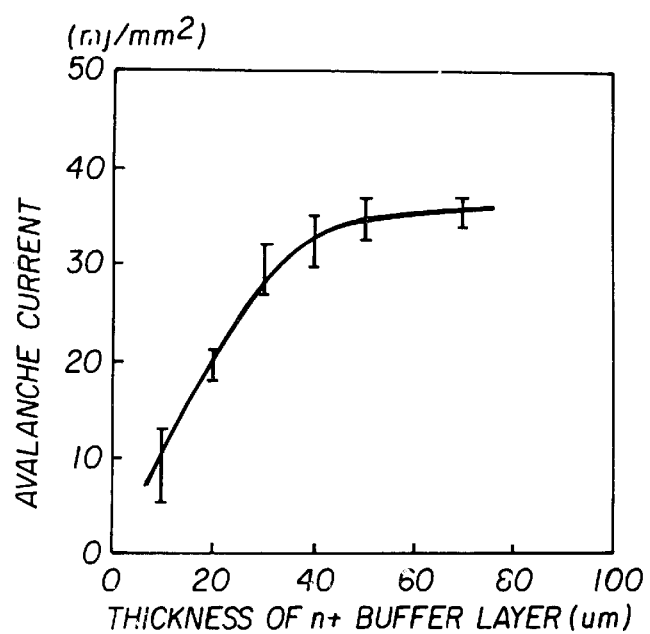
FIG. 5 is a graph showing the relationship between avalanche current and the thickness of an n+ buffer layer.

FIG. 5 is a graph showing the relationship between the avalanche current and the thickness of n+ buffer layer. The horizontal axis indicates the thickness of the n+ buffer layer, and the vertical axis indicates the avalanche current per unit area. The avalanche current increases as the thickness of the n+ buffer layer increases, but tends to be saturated after the thickness reaches about 30 μm. To achieve avalanche current of 200 mJ, the chip area (more precisely, area of an active region) may be as small as 10 mm² if the n+ buffer layer has a thickness of 30 μm, but the chip area must be doubled to be 20 mm² if the n+ buffer has a thickness of 10 μm.

Figure 6:
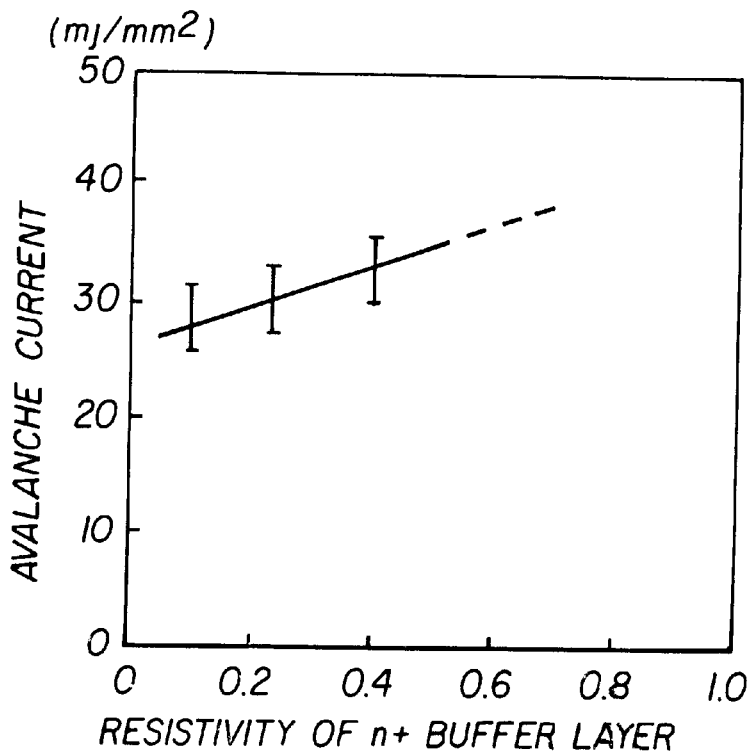
FIG. 6 is a graph showing the relationship between avalanche current and the resistivity of the n+ buffer layer.

FIG. 6 is a graph showing the relationship between the avalanche current and the resistivity of n+ buffer layer where the thickness of the n+ buffer layer is controlled to 30 μm. The horizontal axis indicates the resistivity of n+ buffer layer, and the vertical axis indicates the avalanche current.

It is understood from the results obtained in the range of this experiment that the avalanche current tends to slowly increase as the resistivity of the n+ buffer increases, and that the resistivity is favorably held in a range of 0.1 to 0.4 Ω·cm.

If avalanche breakdown occurs upon application of a high voltage to the IGBT, a depletion layer spreads throughout the n drift layer, and is supposed to reach the n+ buffer layer. The avalanche current increases with an increase in the thickness of the n+ buffer layer or an increase in the resistivity of this layer, as shown in FIG. 5 and FIG. 6, probably because a portion of the n+ buffer layer that is not turned ed into a depletion layer provides ballast resistance, and functions to average the current flowing through the whole device.

It was confirmed from later experiments that the above effect may be achieved by controlling the resistivity of the n+ buffer layer to be within the range of 0.05 to 1 Ω·m and controlling its thickness to be within the range of 30 to 80 μm, not only in the MOS type semiconductor device having the series Zener diode array as in the first embodiment, but also in other MOS type semiconductor devices that are not provide with a Zener diode array.

Second Embodiment

Figure 7:
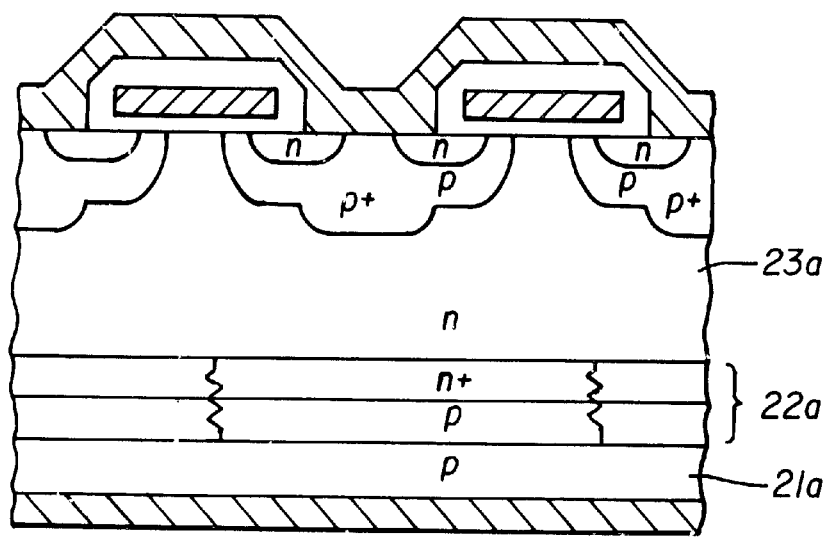
FIG. 7 is a cross-sectional view of a part of IGBT according to the second embodiment of the present invention.

FIG. 7 is a cross-sectional view of a part of IGBT according to the second embodiment of the present invention. This embodiment is basically similar to the first embodiment of FIG. 1, but different from the first embodiment in that a p/n+ buffer layer 22a, rather than single conductivity type n+ buffer layer, is formed between the n drift layer 23a and the p drain layer 21a. The p/n+ buffer layer 22a has almost the same resistivity as the n+ buffer layer of the first embodiment. A p layer of the p/n+ buffer layer 22a has a lower impurity concentration than the p drain layer 21a.

The relationship between the avalanche current and the thickness of the buffer layer was examined with respect to the IGBT having the p/n+ buffer layer 22a, and was found to be similar to that of the first embodiment.

Third Embodiment

Figure 8:
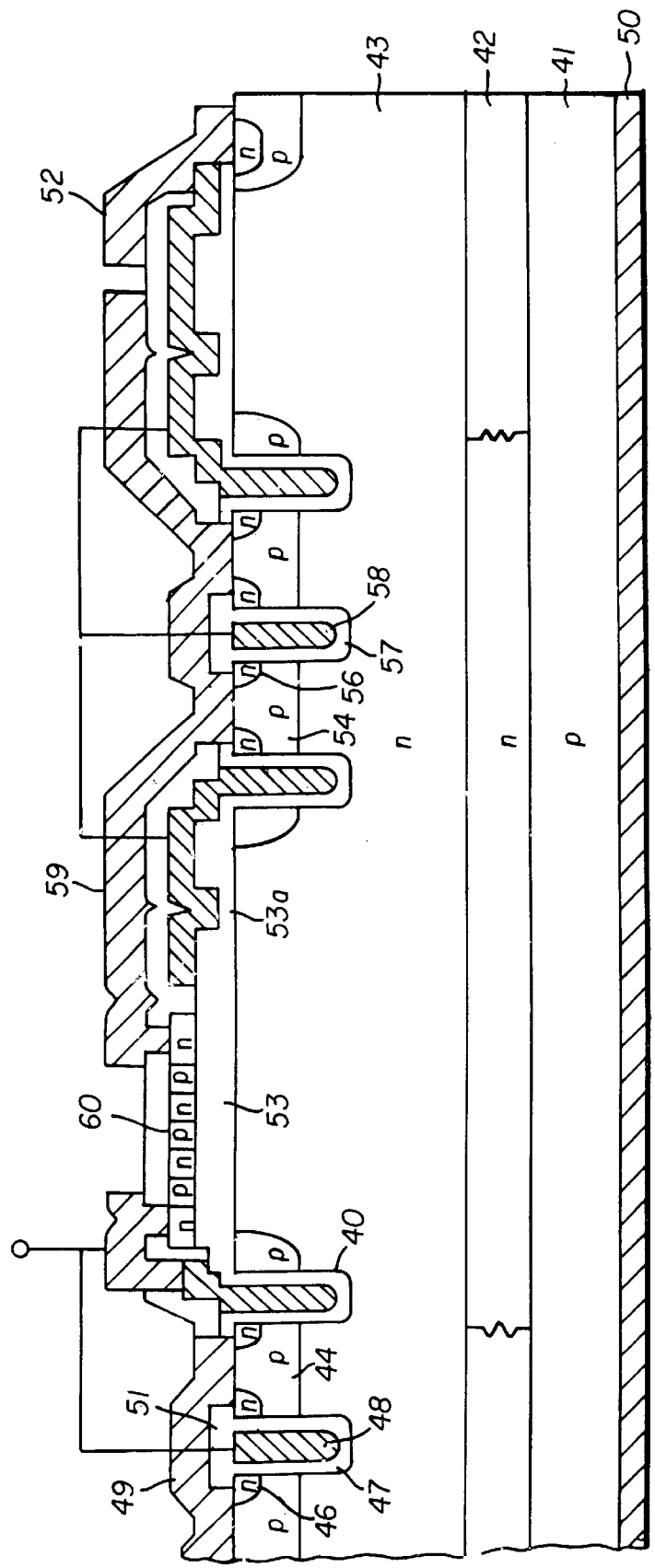
FIG. 8 is a cross-sectional view of a part of IGBT according to the third embodiment of the present invention.

FIG. 8 is a cross-sectional view showing a part of IGBT according to the third embodiment of the present invention. While an array of reversely connected pairs of Zener diodes 60 is provided between the main IGBT portion and the auxiliary IGBT portion, as in the first embodiment of FIG. 1, the structures of the main IGBT and auxiliary IGBT are slightly different from those of the first embodiment.

Namely, a trench 40 is formed in a surface layer of an n drift layer 43 having a high resistivity, to extend from one of opposite major surfaces of the n drift layer 43. P base regions 44 are formed on the opposite sides of the trench 40, and n source regions 46 are formed in surface layers of the p base regions 44, such that the p base regions 44 and n source regions 46 are exposed to the inner wall of the trench 40. The interior of the trench 40 is filled with a gate electrode layer 48 formed of polycrystalline silicon, with a gate oxide film 47 filling a clearance between the inner wall of the trench 40 and the electrode layer 48. In this manner, n channel type IGBT is produced. The open end of the trench 40 is covered with an insulating film 51 made of boron phosphorous silica glass (BPSG), and contact holes are formed so that a source electrode 49 contacts with surfaces of both of the p base regions 44 and n source regions 46, and so that a gate electrode (not shown) made of a metal contacts with the gate electrode layer 48. A drain electrode 50 is formed on the surface of a p drain layer 41. In many cases, the source electrode 49 extends over the gate electrode layer 48, with the insulating film 51 interposed between the electrode 49 and the electrode layer 48, as shown in FIG. 8.

Similarly, the auxiliary IGBT portion is formed with a trench which is filled with an auxiliary gate electrode layer 48, with an auxiliary gate oxide film 57 filling a space between the inner wall of the trench and the electrode layer 48. The IGBT of this trench-gate type can be formed with high cell density, and thus has been increasingly used as a power semiconductor device. In this embodiment, too, a peripheral electrode 52 held at the same potential as the drain electrode 50 is connected to the auxiliary gate electrode layer 58, as in the IGBT of the first embodiment. Also, an auxiliary source electrode 59 is connected to one end of the series Zener diode array 60, and an electrode taken out from the other end of the series Zener diode array 60 is connected to the gate electrode layer 48 of the main IGBT portion 1.

The IGBT of the present embodiment operates in the same manner as that of the first embodiment. When the auxiliary IGBT is turned on, its current passes through the series Zener diode array 60, to be supplied to the gate electrode layer 48 of the main IGBT portion 1, whereby the main IGBT portion is turned on. Since the conductivity can be modulated when the current flows, only a small area is required to supply a large amount of current, thus enabling the main IGBT portion to be quickly turned on, with a result of an increase in the avalanche current.

Fourth Embodiment

Figure 9:
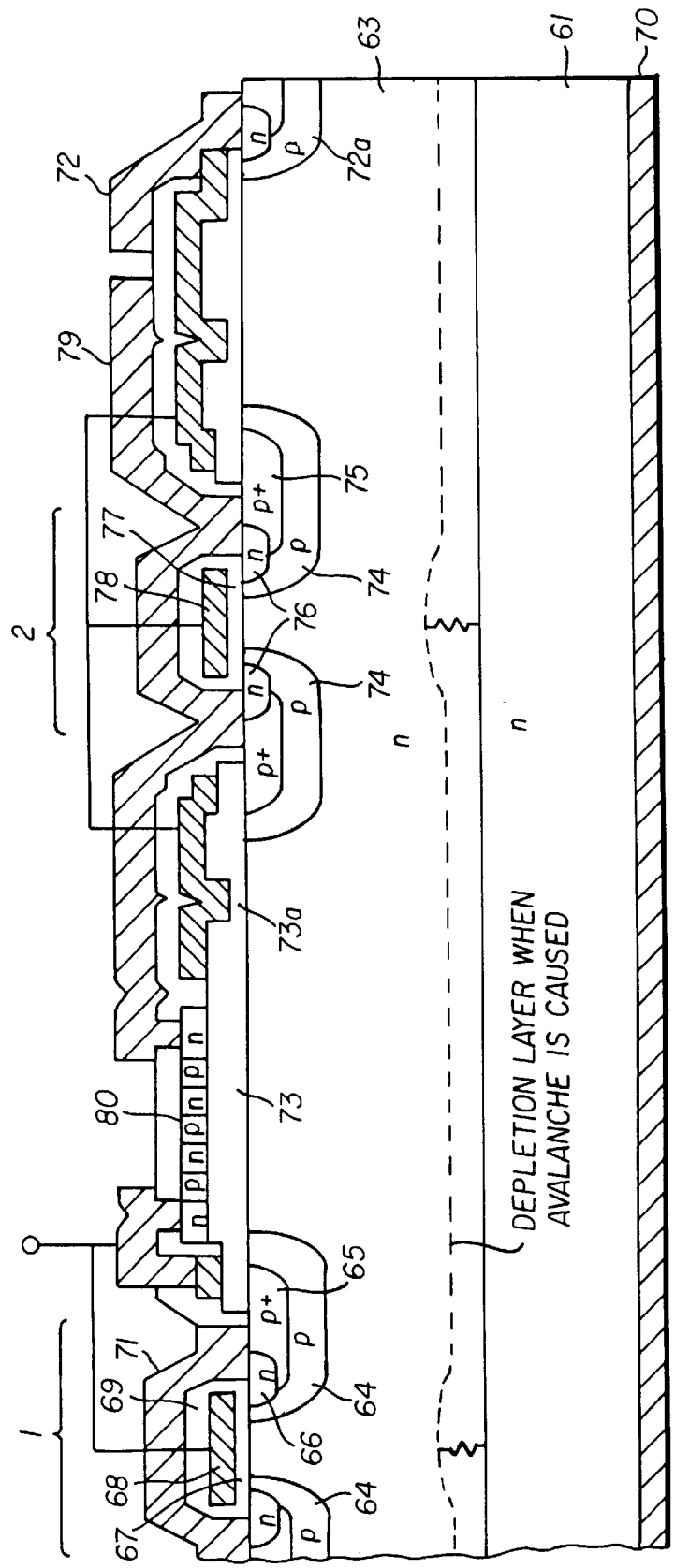
FIG. 9 is a cross-sectional view of a part of IGBT according to the fourth embodiment of the present invention.

FIG. 9 is a cross sectional view showing a part of MOSFET as a semiconductor device according to the fourth embodiment of the present invention.

A left end portion of FIG. 9 shows an active region of a main MOSFET portion 1 that performs switching of current. The structure of this active region is substantially identical with that of a known MOSFET. Namely, mutually separated p base regions 64 are formed in a surface layer of an n drift layer 63 having high resistivity, at one of opposite major surfaces of the drift layer 63, and n source regions 66 are formed in selected areas of surface layers of the p base regions 64. An n+ buffer layer 61 is formed on the other major surface of the n drift layer 63. A gate electrode layer 68 made of polycrystalline silicon is formed on a gate oxide film 67 over surfaces of the p base regions 64 interposed between the n source regions 66 and the n drift layer 63. The surface of the gate electrode layer 68 is covered with an insulating film 71 formed of boron phosphorous silica glass (BPSG), for example, and a main source electrode 69 is formed on the insulating film 71 such that the electrode 69 is held in contact with surfaces of both of the p base regions 64 and the n source regions 64. A contact hole is formed through the source electrode 69 so that a gate electrode (not illustrated) contacts with the gate electrode layer 68. In many cases, the source electrode 69 extends over the gate electrode layer 68, with the insulating film 71 interposed between the electrode 69 and the electrode layer 68, as shown in FIG. 9.

The right-side portion of FIG. 9 shows a cross section of an auxiliary MOSFET portion 2. The structure of the auxiliary MOSFET portion 2 is almost identical with the main MOSFET portion 1. Auxiliary p base regions 74 are formed in a surface layer of the n drift layer 63, and auxiliary n source regions 76 are formed in selected areas of surface layers of the auxiliary p base regions 74. An auxiliary gate electrode layer 78 made of polycrystalline silicon is formed on an auxiliary gate oxide film 77 over surfaces of the auxiliary p base regions 74 interposed between the auxiliary n source regions 76 and the n drift layer 63. In this manner, an n channel type MOSFET is produced. The surface of the auxiliary gate electrode layer 78 is covered with an insulating film 71 formed of boron phosphorous silica glass (BPSG), for example, on which an auxiliary source electrode 79 is provided. Contact holes are formed so that the auxiliary source electrode 79 contacts with surfaces of both of the auxiliary p base regions 74 and auxiliary n source regions 76. The structure on the other side of the n drift layer 63 is identical with that of the main MOSFET portion 1.

Between the main MOSFET portion 1 and the auxiliary MOSFET portion 2, an array of reversely connected pairs of Zener diodes 80 are formed on a thick oxide film 73 that is formed on the n drift layer 63.

It will be understood from the cross-sectional view of FIG. 9 that a peripheral electrode 72 is connected to the auxiliary gate electrode layer 78, and the auxiliary source electrode 79 is connected to one end of the series Zener diode array 80, while an electrode taken out from the other end of the series Zener diode array 80 is connected to the gate electrode layer 68 of the main MOSFET portion.

To produce the IGBT of the third embodiment, which is a 60V-class device, a wafer is prepared by forming the n drift layer 23 by epitaxially growing an n layer having a resistivity of 0.5 Ω·cm and a thickness of about 7.5 $\mu$m on an n type silicon substrate having a resistivity of 0.004 Ω·cm and a thickness of 350 $\mu$m. The rest of the structure may be produced by almost the same process as used for producing a known MOSFET, except for some minor changes, such as different patterns of masks, for example. Namely, the main and auxiliary p base regions 64, 74 and p regions of the series Zener diode array 80 are formed by implantation of boron ions and thermal diffusion, and the main and auxiliary n source regions 66, 76 and n regions of the series Zener diode array 80 are formed by implantation of arsenic ions or phosphorous ions and thermal diffusion. The series Zener diode array 80 is formed from a polycrystalline silicon layer that is applied by the same reduced-pressure CVD as employed for forming the main and auxiliary gate electrode layers 68, 78. The main and auxiliary p base regions 64, 74 and main and auxiliary n source regions 66, 76 are formed by using the main and auxiliary gate electrode layers 68, 78 as part of masks, so that the edges of these regions 64, 74, 66, 76 are suitably positioned, and the widths of these regions are determined by lateral diffusion of the respective ions. The main and auxiliary source electrodes 69, 79 and gate electrode are formed by sputtering of Al alloy and subsequent photolithography, and the drain electrode 70 is formed by depositing three layers of Ti, Ni and Au by sputtering, so as to be soldered to a metallic substrate.

The dimensions of respective elements of the main and auxiliary MOSFET portions may be determined as follows, for example. The diffusion depth of the main and auxiliary p base regions 64, 74 is 3 $\mu$m, and the diffusion depth of the main and auxiliary p$^+$ contact regions 65, 75 is 0.6 $\mu$m, while the diffusion depth of the main and auxiliary n source regions 66, 76 is 0.3 $\mu$m. The main and auxiliary gate insulating films 67, 77 have a thickness of 25 nm, and the gate electrode layers 68, 78 made of polycrystalline silicon and the insulating film 71 have a thickness of 1 $\mu$m, while the main and auxiliary source electrodes 69, 79 have a thickness of about 5 $\mu$m.

The operation of the MOSFET of the fourth embodiment constructed as described above will be next explained. The main source electrode 69 is grounded, and the drain electrode 70 is connected to a power supply via an inductive load. When the MOSFET is switched from an ON state to an OFF state, namely, when the MOSFET is turned off, the voltage applied to the drain electrode 70 is increased due to an energy stored in an inductor, as stated above. At this time, the voltage applied to the drain electrode 70 is also applied to the auxiliary gate electrode layer 78 of the auxiliary MOSFET portion through the peripheral electrode 72. On the other hand, the auxiliary source electrode 79 of the auxiliary MOSFET portion is held at a voltage that is as high as a voltage defined by the clamping voltage of the series Zener diode array 80. If a difference between this voltage and collector voltage exceeds a certain value, the auxiliary MOSFET is turned on.

When the auxiliary MOSFET portion is turned on, its current passes through the series Zener diode array 80, to be supplied to the gate electrode layer 68 of the main MOSFET portion, whereby the main MOSFET portion is turned on. In this manner, the energy stored in the inductor is released.

In the MOSFET of the fourth embodiment as described above, the current that passes through the auxiliary IGBT portion is supplied to the gate electrode layer 68 of the main MOSFET portion, in order to protect the device when an excessive voltage is applied. Thus, the MOSFET can be surely protected against excessively high voltage applied thereto, assuring increased avalanche current, or improved capability to withstand avalanche breakdown.

In FIG. 9, the thick oxide film 73 includes a thin portion 73a at which the thickness of the oxide film 73 is reduced so that a corresponding portion of the auxiliary gate electrode layer 78 is made closes to the surface of the silicon substrate. The thin portion 73a serves to prevent an inversion layer from appearing in the vicinity of the surface of the silicon substrate under the thick oxide film 73, and avoid flow of current from the auxiliary p base regions 74 and the p peripheral region 72a to the p base regions 64 of the main IGBT portion.

Another important feature of the MOSFET of the fourth embodiment is that the n drift layer 63 is formed with a thickness of 7.5 $\mu$m.

Figure 10:
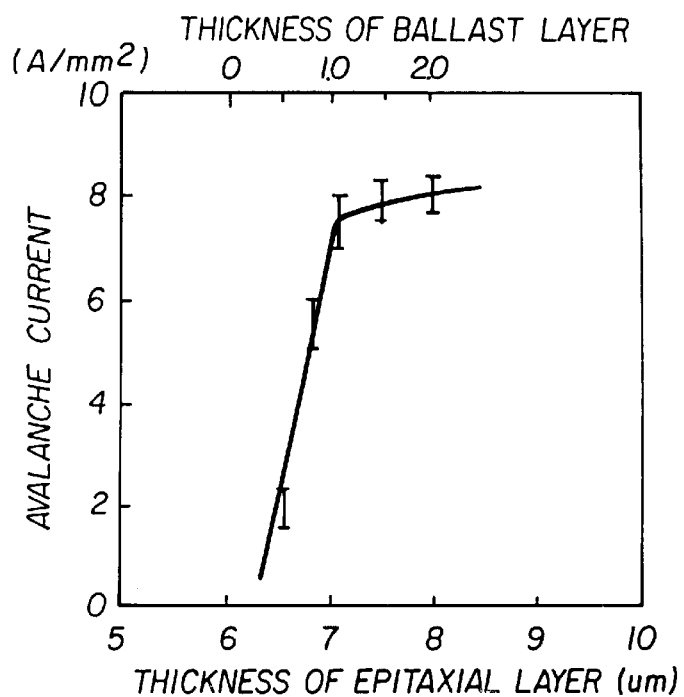
FIG. 10 is a graph showing the relationship between avalanche current and the thickness of an n drift layer.
Figure 11:
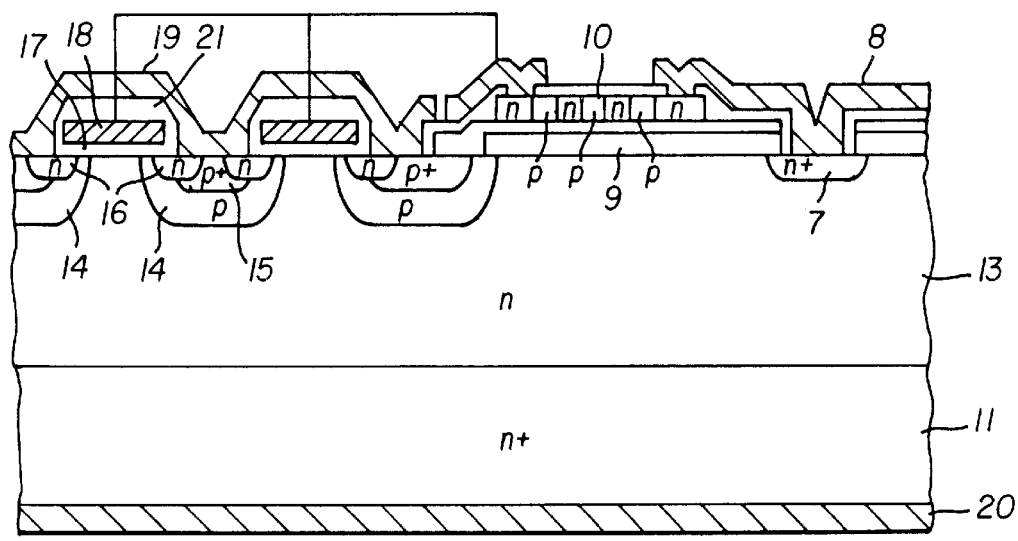
FIG. 11 is a cross sectional view of a part of a known MOSFET.

FIG. 10 is a graph showing the relationship between the avalanche current and the thickness of the n drift layer. The horizontal axis indicates the thickness of the n drift layer, and the vertical axis indicates the avalanche current per unit area. The avalanche current increases as the thickness of the n buffer layer increases, but tends to be saturated after the thickness reaches about 7 $\mu$m. The horizontal axis may be also considered to indicate changes in the thickness of the n drift layer that is not depleted, or the thickness of a ballast layer as denoted above the graph.

In the MOSFET of the fourth embodiment, which is of 60V-class, the depletion layer extends down to a depth of about 3 $\mu$m at 60V when the resistivity of the n drift layer is 0.5 Ω·m. Since the diffusion depth of the p base regions is 3 $\mu$m, almost the entire portion of the n drift layer is depleted if the n drift layer having a considerably small avalanche current has a thickness of 6 $\mu$m. If a portion of the n drift layer which is not depleted has a thickness of 1 $\mu$m or greater, on the other hand, the MOSFET ensures sufficiently high avalanche current, and operates with high stability.

The avalanche current is increased with an increase in the thickness of the n drift layer, since the portion of the n drift layer that is not depleted, in other words, ballast layer, provides high resistance, and functions to average current flowing through the whole device.

The resistivity of the ballast layer, or high resistance layer, is controlled to be substantially equal to or smaller than that of the n drift layer, but larger than one-tenth of that of the n drift layer, for example. To achieve sufficiently high avalanche current, therefore, the thickness of the high-resistance ballast layer that is not depleted upon avalanche breakdown is controlled to be 0.5 $\mu$m or larger.

It was confirmed from later experiments that the above effect may be achieved by controlling the thickness of the high resistance ballast layer to be 0.5 $\mu$m or greater, not only in the MOS type semiconductor device having the series Zener diode array as in the illustrated embodiments, but in other MOS type semiconductor devices having no Zener diode array.

While the present invention is applied to vertical IGBT and vertical MOSFET in the illustrated embodiments, the invention is equally applicable to other types of insulated gate thyristors, and the like. Further, a plurality of features of the invention may be incorporated into a single MOS type semiconductor device, so that the device exhibits further excellent characteristics, due to the combined effects of these features.

As explained above, in a high breakdown voltage MOS type semiconductor apparatus of the present invention, a first MOS type semiconductor device through which first current flows, and a second MOS type semiconductor device through which second current smaller than the first current flows and which has substantially the same structure as the first MOS type semiconductor device are formed on the same semiconductor substrate. The first and second MOS type semiconductor devices have a common drain electrode, and the gate electrode of the second MOS type semiconductor device is connected to the drain electrode. This semiconductor apparatus further includes a plurality of reversely connected pairs of Zener diodes that are connected in series. This Zener diode array is provided between the source electrode of the second MOS type semiconductor device and the gate electrode of the first MOS type semiconductor device. When an excessive voltage is applied between the drain electrode and the gate electrode of the first MOS type semiconductor device, the second MOS type semiconductor device is turned on, and the current is supplied to the gate electrode of the first MOS type semiconductor device through the Zener diode array, whereby the first MOS type semiconductor device is turned on, and the avalanche current of the MOS type semiconductor apparatus can be significantly increased.

If a pair of reversely connected Zener diodes or a resistor is provided between the gate electrode and source electrode of the first MOS type semiconductor device, this device can be protected when an excessive voltage is applied, or when the gate electrode is disconnected.

The MOS type semiconductor device may be in the form of a planar type or trench-gate-type vertical MOSFET or IGBT.

In a vertical IGBT, in particular, a ballast resistance layer, which includes a portion having a resistivity of 0.05 to 1 Ω·cm and a thickness of about 30 µm to 80 µm, is preferably provided between the first conductivity type drift layer and the second conductivity type drain layer, so that the avalanche current can be significantly increased, as shown in the illustrated embodiment.

In a vertical MOSFET, a ballast resistance layer is preferably provided between the first conductivity type drift layer and the second conductivity type drain layer. The ballast resistance layer provides a region that will not be depleted even if avalanche breakdown occurs upon application of a high voltage to the MOS type semiconductor device while being placed in an OFF state, and has a resistivity that is substantially equal to or smaller than that of the first conductivity type drift layer, but larger than one-tenth of that of the first conductivity type drift layer, and a thickness that is at least about 1 µm. With this ballast resistance layer thus provided, the avalanche current can be significantly increased.

In recent years, MOS type semiconductor devices used as switching devices in a switching circuit are more likely to be subjected to severe stresses caused by surge voltage, or the like, because of simplified configuration of the switching circuit from which snubbers are eliminated, for example, and reduction in the size of the semiconductor device. In this situation, the present invention makes a significant contribution to improvement of the capability of the device to withstand avalanche breakdown.

High breakdown voltage MOS type semiconductor apparatus of the present invention can be applied for driving a solenoid valve and motor, and also applied to a switching power supply utilizing a DC—DC converter method. In particular, an IGBT of the present invention is also able to be applied for driving an ignition coil as a main switching device for an automobile in severe environmental conditions.

What is claimed is:

1. A MOS type semiconductor device, comprising:
   a first main surface and a second main surface which face in opposite directions;
   a first conductivity type drift layer having a high resistivity;
   a second conductivity type base region formed in a surface layer of said first conductivity type drift layer on the side of said first main surface;
   a first conductivity type source region that is spaced from said first conductivity type drift layer by said second conductivity type base region;
   a gate electrode layer formed on a gate insulating film over a surface of said second conductivity type base region interposed between said first conductivity type source region and said first conductivity type drift layer;
   a source electrode formed in contact with both of said first conductivity type source region and said second conductivity type base region;
   a second conductivity type drain layer formed on a surface of said first conductivity type drift layer on the side of said second main surface;
   a drain electrode electrically connected to said second conductivity type drain layer; and
   a gate electrode formed in contact with said gate electrode layer;
   wherein a ballast resistance layer is provided between said first conductivity type drift layer and said second conductivity type drain layer, said ballast resistance layer including a portion having a resistivity in a range of 0.05 to 1 Ω·cm and a thickness in a range of about 30 µm to 80 µm.

2. A MOS type semiconductor device according to claim 1, wherein the resistivity of said ballast resistance layer is in a range of 0.1 to 0.4 Ω·cm.

3. A MOS type semiconductor device according to claim 1, wherein said ballast resistance layer is of first conductivity type.

4. A MOS type semiconductor device, comprising:
   a first main surface and a second main surface which face in opposite directions;
   a first conductivity type drift layer having a high resistivity;
   a second conductivity type base region formed in a surface layer of said first conductivity type drift layer on the side of said first main surface;
   a first conductivity type source region that is spaced from said first conductivity type drift layer by said second conductivity type base region;
   a gate electrode layer formed on a gate insulating film over a surface of said second conductivity type base region interposed between said first conductivity type source region and said first conductivity type drift layer;

a source electrode formed in contact with both of said first conductivity type source region and said second conductivity type bases region;

a second conductivity type drain layer formed on a surface of said first conductivity type drift layer on the side of said second main surface;

a drain electrode formed on said second main surface in contact with a surface of said second conductivity type drain layer; and a gate electrode formed in contact with said gate electrode layer;

wherein a ballast resistance layer is provided between said first conductivity type drift layer and said second conductivity type drain layer, said ballast resistance layer including a portion having a resistivity in a range of 0.05 to 1 Ω·cm and a thickness in a range of about 30 µm to 80 µm; and wherein said ballast resistance layer comprises a first conductivity type portion that contacts with said first conductivity type drift layer, and a second conductivity type portion that contact with said second conductivity type drain layer.

5. A MOS type semiconductor apparatus, comprising a first MOS type semiconductor device through which first current flows, and a second MOS type semiconductor device through which second current that is smaller than the first current flows, said first MOS type semiconductor device and said second MOS type semiconductor device having substantially the same structure and being provided on the same semiconductor substrate, each of the first and second MOS type conductive devices comprising:

first main surface and second main surface which face in opposite directions;

a first conductivity type drift layer having a high resistivity;

a second conductivity type base region formed in a surface layer of said first conductivity type drift layer on the side of said first main surface;

a first conductivity type source region that is spaced from said first conductivity type drift layer by said second conductivity type base region;

a gate electrode layer formed on a gate insulating film over a surface of said second conductivity type base region interposed between said first conductivity type source region and said first conductivity type drift layer;

a source electrode formed in contact with both of said first conductivity type source region and said second conductivity type base region;

a second conductivity type drain layer formed on a surface of said first conductivity type drift layer on the side of said second main surface;

a drain electrode electrically connected to said second conductivity type drain layer; and a gate electrode formed in contact with said gate electrode layer, wherein a ballast resistance layer is provided between said first conductivity type drift layer and said second conductivity type drain layer, said ballast resistance layer including a portion having a resistivity in a range of 0.05 to 1 Ω·cm and a thickness in a range of about 30 µm to 80 µm.

6. AMOS type semiconductor apparatus according to claim 5, wherein the resistivity of said ballast resistance layer is in a range of 0.1 to 0.4 Ω·cm.

7. A MOS type semiconductor apparatus according to claim 5, wherein said ballast resistance layer is of first conductivity type.

8. A MOS type semiconductor apparatus, comprising a first MOS type semiconductor device through which first current flows, and a second MOS type semiconductor device through which second current that is smaller than the first current flows, said first MOS type semiconductor device and said second MOS type semiconductor device having substantially the same structure and being provided on the same semiconductor substrate, each of the first and second MOS type conductive devices comprising:

first main surface and second main surface which face in opposite directions;

a first conductivity type drift layer having a high resistivity;

a second conductivity type base region formed in a surface layer of said first conductivity type drift layer on the side of said first main surface;

a first conductivity type source region that is spaced from said first conductivity type drift layer by said second conductivity type base region;

a gate electrode layer formed on a gate insulating film over a surface of said second conductivity type base region interposed between said first conductivity type source region and said first conductivity type drift layer;

a source electrode formed in contact with both of said first conductivity type source region and said second conductivity type base region;

a second conductivity type drain layer formed on a surface of said first conductivity type drift layer on the side of said second main surface;

a drain electrode formed on said second main surface in contact with a surface of said second conductivity type drain layer; and a gate electrode formed in contact with said gate electrode layer, wherein a ballast resistance layer is provided between said first conductivity type drift layer and said second conductivity type drain layer, said ballast resistance layer including a portion having a resistivity in a range of 0.05 to 1 Ω·cm and a thickness in a range of about 30 µm to 80 µm; and wherein said ballast resistance layer comprises a first conductivity type portion that contacts with said first conductivity type drift layer, and a second conductivity type portion that contact with said second conductivity type drain layer.

9. A MOS type semiconductor device, comprising:

first main surface and second main surface which face in opposite directions;

a first conductivity type drift layer having a high resistivity;

a second conductivity type base region formed in a surface layer of said first conductivity type drift layer on the side of said first main surface;

a first conductivity type source region that is spaced from said first conductivity type drift layer by said second conductivity type base region;

a gate electrode layer formed on a gate insulating film over a surface of said second conductivity type base region interposed between said first conductivity type source region and said first conductivity type drift layer;

a source electrode formed in contact with both of said first conductivity type source region and said second conductivity type base region;

a first conductivity type drain layer formed on a surface of said first conductivity type drift layer on the side of said second main surface, said first conductivity type drain layer having a smaller resistivity than said first conductivity type drift layer;

a drain electrode electrically connected to said first conductivity type drain layer; and a gate electrode formed in contact with said gate electrode layer, wherein a first conductivity type ballast resistance layer is provided between said first conductivity type drift layer and said first conductivity type drain layer, said ballast resistance layer providing a region that will not be depleted when avalanche breakdown occurs upon application of a high voltage to the MOS type semiconductor device that is placed in an OFF state, said ballast resistance layer having a resistivity that is substantially equal to or smaller than that of said first conductivity type drift layer, and larger than one-tenth of that of the first conductivity type drift layer, and a thickness that is at least about 1 μm.

10. A MOS type semiconductor device according to claim 9, wherein the thickness of said ballast resistance layer is not larger than one half of that of said first conductivity type drift layer.

11. A MOS type semiconductor apparatus, comprising a first MOS type semiconductor device through which first current flows, and a second MOS type semiconductor device through which second current that is smaller than the first current flows, said first MOS type semiconductor device and said second MOS type semiconductor device having substantially the same structure and being provided on the same semiconductor substrate, each of the first and second MOS type conductive devices comprising:

first main surface and second main surface which face in opposite directions;

a first conductivity type drift layer having a high resistivity;

a second conductivity type base region formed in a surface layer of said first conductivity type drift layer on the side of said first main surface;

a first conductivity type source region that is spaced from said first conductivity type drift layer by said second conductivity type base region;

a gate electrode layer formed on a gate insulating film over a surface of said second conductivity type base region interposed between said first conductivity type source region and said first conductivity type drift layer;

a source electrode formed in contact with both of said first conductivity type source region and said second conductivity type base region;

a first conductivity type drain layer formed on a surface of said first conductivity type drift layer on the side of said second main surface, said first conductivity type drain layer having a smaller resistivity than said first conductivity type drift layer;

a drain electrode electrically connected to said first conductivity type drain layer; and a gate electrode formed in contact with said gate electrode layer, wherein a first conductivity type ballast resistance layer is provided between said first conductivity type drift layer and said first conductivity type drain layer, said ballast resistance layer providing a region that will not be depleted when avalanche breakdown occurs upon application of a high voltage to the MOS type semiconductor device that is placed in an OFF state, said ballast resistance layer having a resistivity that is substantially equal to or smaller than that of said first conductivity type drift layer, and larger than one-tenth of that of the first conductivity type drift layer, and a thickness that is at least about 1 μm.

12. A MOS type semiconductor apparatus according to claim 11, wherein the thickness of said ballast resistance layer is not larger than one half of that of said first conductivity type drift layer.

13. A MOS type semiconductor apparatus, comprising a first MOS type semiconductor device through which first current flows, and a second MOS type semiconductor device through which second current that is smaller than the first current flows, said first MOS type semiconductor device and said second MOS type semiconductor device having substantially the same structure and being provided on the same semiconductor substrate, each of the first and second MOS type conductive devices comprising:

first main surface and second main surface which face in opposite directions;

a first conductivity type drift layer having a high resistivity;

a second conductivity type base region formed in a surface layer of said first conductivity type drift layer on the side of said first main surface;

a first conductivity type source region that is spaced from said first conductivity type drift layer by said second conductivity type base region;

a trench formed in said first conductivity type drift layer such that said first conductivity type source region is exposed to an inner wall of the trench, said trench having a larger depth than said second conductivity type base region;

a gate electrode layer formed in said trench with a gate insulating film filling a space between the gate electrode layer and the inner wall of the trench;

a source electrode formed in contact with both of said first conductivity type source region and said second conductivity type base region;

a second conductivity type drain layer formed on a surface of said first conductivity type drift layer on the side of said second main surface;

a drain electrode electrically connected to said second conductivity type drain layer; and a gate electrode formed in contact with said gate electrode layer, wherein a thick field insulating film is disposed on said first main surface at least between said first MOS type semiconductor device and said second MOS type semiconductor device.

14. A MOS type semiconductor apparatus according to claim 13, wherein at least a Zener diode is provided on said thick field insulating film.

15. A MOS type semiconductor apparatus, comprising a first MOS type semiconductor device through which first current flows, and a second MOS type semiconductor device through which second current that is smaller than the first current flows, said first MOS type semiconductor device and said second MOS type semiconductor device having substantially the same structure and being provided on the same semiconductor substrate, each of the first and second MOS type conductive devices comprising:

first main surface and second main surface which face in opposite directions;

a first conductivity type drift layer having a high resistivity;

a second conductivity type base region formed in a surface layer of said first conductivity type drift layer on the side of said first main surface;

a first conductivity type source region that is spaced from said first conductivity type drift layer by said second conductivity type base region;

a trench formed in said first conductivity type drift layer such that said first conductivity type source region is exposed to an inner wall of the trench, said trench having a larger depth than said second conductivity type base region;

a gate electrode layer formed in said trench with a gate insulating film filling a space between the gate electrode layer and the inner wall of the trench;

a source electrode formed in contact with both of said first conductivity type source region and said second conductivity type base region;

a first conductivity type drain layer formed on a surface of said first conductivity type drift layer on the side of said second main surface, said first conductivity type drain layer having a smaller resistivity than said first conductivity type drift layer;

a drain electrode electrically connected to said first conductivity type drain layer; and a gate electrode formed in contact with said gate electrode layer;

wherein a thick field insulating film is disposed on said first main surface at least between said first MOS type semiconductor device and said second MOS type semiconductor device.

16. A MOS type semiconductor apparatus according to claim 15, wherein at least a Zener diode is provided on said thick field insulating film.

* * * * *